United States Patent
Ishiguro et al.

(10) Patent No.: US 9,461,109 B1
(45) Date of Patent: Oct. 4, 2016

(54) METHOD OF FORMING SUPERJUNCTION HIGH VOLTAGE DEVICES USING WAFER BONDING

(71) Applicant: Icemos Technology Ltd., Belfast (GB)

(72) Inventors: Takeshi Ishiguro, Fukushima-ken (JP); Samuel Anderson, Tempe, AZ (US)

(73) Assignee: Icemos Technology, Ltd., Belfast (GB)

(*) Notice: Subject to any disclaimer, the term of this patent is extended or adjusted under 35 U.S.C. 154(b) by 0 days.

(21) Appl. No.: 14/751,289

(22) Filed: Jun. 26, 2015

Related U.S. Application Data (60) Provisional application No. 62/017,311, filed on Jun. 26, 2014.

(51) Int. Cl.
| | | |
|---|---|---|
| *H01L 29/06* | (2006.01) | |
| *H01L 27/06* | (2006.01) | |
| *H01L 29/66* | (2006.01) | |
| *H01L 21/762* | (2006.01) | |
| *H01L 21/768* | (2006.01) | |
| *H01L 29/417* | (2006.01) | |

(52) U.S. Cl.
CPC ..... *H01L 29/0634* (2013.01); *H01L 21/76237* (2013.01); *H01L 21/76802* (2013.01); *H01L 21/76877* (2013.01); *H01L 29/0649* (2013.01); *H01L 29/41758* (2013.01); *H01L 29/66568* (2013.01)

(58) Field of Classification Search
CPC ............. H01L 29/0634; H01L 21/76237; H01L 21/76802; H01L 29/7822
USPC ......... 438/296, 456, 457, 458; 257/339, 487
See application file for complete search history.

(56) References Cited

U.S. PATENT DOCUMENTS

| | | | | |
|---|---|---|---|---|
| 2005/0181577 A1* | 8/2005 | Hshieh | ............... | H01L 29/0634 438/427 |
| 2008/0258239 A1* | 10/2008 | Ishiguro | ............. | H01L 29/0634 257/397 |
| 2009/0085147 A1* | 4/2009 | Ishiguro | ............. | H01L 29/0634 257/499 |
| 2011/0193176 A1* | 8/2011 | Anderson | .......... | H01L 29/0634 257/401 |

* cited by examiner

*Primary Examiner* — Julio J Maldonado
*Assistant Examiner* — Omar Mojaddedi
(74) *Attorney, Agent, or Firm* — Panitch Schwarze Belisario & Nadel LLP (57) ABSTRACT

A method of forming a superjunction device includes providing a semiconductor layer having first and second opposing main surfaces and a first doping concentration of a dopant of a first conductivity type, forming at least one device proximate the first main surface, forming at least one trench adjacent to the device and extending into the semiconductor layer from the first main surface, doping at least a portion of a sidewall of the trench with a dopant of a second, different conductivity type to form a first region in the semiconductor layer adjacent to the sidewall and extending at least partially between the first and second main surfaces, providing a substrate with a first dielectric layer arranged thereon, bonding the first dielectric layer to the first main surface to cover the trench and at least a portion of the device, and removing the substrate.

20 Claims, 10 Drawing Sheets

METHOD OF FORMING SUPERJUNCTION HIGH VOLTAGE DEVICES USING WAFER BONDING

CROSS-REFERENCE TO RELATED APPLICATIONS

This application claims priority to U.S. Provisional Patent Application Publication No. 62/017,311, filed on Jun. 26, 2014, entitled "Method of Forming Superjunction High Voltage Devices Using Wafer Bonding," the entire contents of which are incorporated by reference herein.

BACKGROUND OF THE INVENTION

Embodiments of the present invention relate generally to superjunction devices, and more particularly, to superjunction devices manufactured using wafer bonding.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171, and 6,307,246 are examples of such efforts and are incorporated herein by reference.

Superjunction devices, including, but not limited to metal-oxide-semiconductor field-effect transistors (MOSFET), diodes, and insulated-gate bipolar transistors (IGBT), have been or will be employed in various applications such as automobile electrical systems, power supplies, and power management applications. For example, superjunction devices may specifically be employed in light emitting diode (LED) televisions, electric or hybrid cars, LED light bulbs, servers, tablets, uninterruptable power supplies (UPS), and the like. Such devices sustain high voltages in the off-state and yield low voltages and high saturation current densities in the on-state.

In conventional trench-type superjunction devices, the process typically involves deep trench etching, sidewall doping, and trench refill. Trench refill is performed using an insulative material, such as tetraethyl orthosilicate (TEOS), organic compounds, or the like. Trench refill further requires the steps of filling the trenches with the refill material, annealing, and planarizing. These additional process steps result in higher manufacturing costs, and introduce potential origins of defects, which impacts the production yield.

It is therefore desirable to provide a method of manufacturing superjunction devices with fewer process steps, that reduces thermal and mechanical stresses derived from particular process steps and materials, and lowers the overall production cost while raising the yield.

BRIEF SUMMARY OF THE INVENTION

Briefly stated, an embodiment of the present invention comprises a method of forming a superjunction device. The method includes providing a semiconductor layer having first and second opposing main surfaces and a first doping concentration of a dopant of a first conductivity type, forming at least one trench extending at least partially into the semiconductor layer from the first main surface thereof, and doping at least a portion of a sidewall of the at least one trench with the dopant of the first conductivity type to form a first region in the semiconductor layer extending at least partially between the first and second main surfaces of the semiconductor layer. The first region has a second doping concentration. The method further includes doping at least a portion of the sidewall of the at least one trench with a dopant of a second conductivity type different from the first conductivity type to form a second region in the semiconductor layer between the sidewall of the at least one trench and the first region and extending at least partially between the first and second main surfaces of the semiconductor layer. The second region has a third doping concentration. The method further includes providing a substrate with a first dielectric layer arranged thereon, bonding the first dielectric layer of the substrate to the first main surface of the semiconductor layer to cover the at least one trench and at least a portion of the first main surface, removing the substrate, removing at least a portion of the first dielectric layer from the first main surface of the semiconductor layer to form at least one active region, and forming a device in the at least one active region.

Another embodiment of the present invention comprises a method of forming a superjunction device. The method includes providing a semiconductor layer having first and second opposing main surfaces and a first doping concentration of a dopant of a first conductivity type, forming at least one device proximate the first main surface of the semiconductor layer, forming at least one trench adjacent to the at least one device and extending at least partially into the semiconductor layer from the first main surface thereof, and doping at least a portion of the sidewall of the at least one trench with a dopant of a second conductivity type different from the first conductivity type to form a first region in the semiconductor layer adjacent to the sidewall of the at least one trench and extending at least partially between the first and second main surfaces of the semiconductor layer. The first region has a second doping concentration. The method further includes providing a substrate with a first dielectric layer arranged thereon, bonding the first dielectric layer of the substrate to the first main surface of the semiconductor layer to cover the at least one trench and at least a portion of the at least one device, and removing the substrate.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping concentration terms should not be construed as limiting.

Referring to the drawings, there is shown in FIGS. 1-7 a first preferred method of manufacturing a superjunction device. A semiconductor substrate 12 is preferably provided having first and second opposing main surfaces 12a, 12b. The semiconductor substrate 12 is preferably formed of silicon (Si), but may be formed of other materials such as gallium arsenide (GaAs), germanium (Ge) or the like. The semiconductor substrate 12 preferably is of the heavily doped $n^+$ type.

Figure 1:
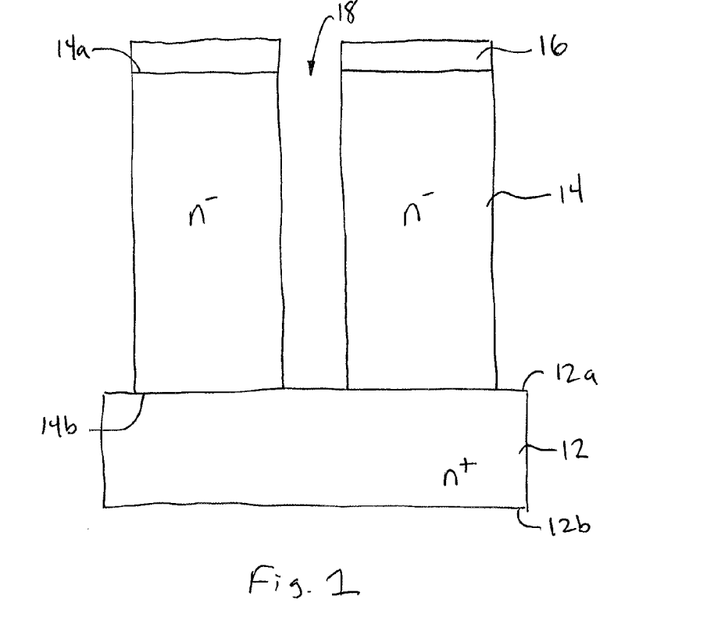
FIG. 1 is a partial sectional elevational view of a semiconductor layer with trenches formed therein in accordance with a first preferred embodiment of the present invention.

A semiconductor layer 14 having first and second opposing main surfaces 14a, 14b is also provided. The second main surface 14b of the semiconductor layer 14 is preferably attached to the first main surface 12a of the semiconductor substrate 12. In the first preferred embodiment, the semiconductor layer 12 is preferably composed of a lightly or intrinsically doped $n^-$ type silicon material, although other like materials and/or doping concentrations may be used as well. In addition, the semiconductor layer 14 is not limited to a single layer of uniform material, but may also be made from multiple layers of the same or differing semiconductor materials. The semiconductor layer 14 is preferably epitaxially grown on the first main surface 12a of the semiconductor substrate. The epitaxial growth or deposition may occur in a suitable reaction chamber at a temperature of up to about 1200° C. Other methods for forming the semiconductor layer 14 on the semiconductor substrate 12, such as by bonding, annealing, and the like, may be used.

A buffer dielectric layer 16 is preferably formed on the first main surface 14a of the semiconductor layer 14. The buffer dielectric layer 16 is preferably an oxide material, although other materials, such as nitrides, silicon-oxynitrides, or other known dielectrics may be used as well. The buffer dielectric layer 16 may be applied using one of thermal growth, low pressure (LP) chemical vapor deposition (CVD), plasma enhanced chemical vapor deposition (PECVD), atmospheric pressure chemical vapor deposition (APCVD), and deposition.

At least one, and preferably a plurality of trenches 18 are formed extending through the buffer dielectric layer 16 and at least partially into the semiconductor layer 14 from the first main surface 14a thereof. In the embodiment shown in FIGS. 1-7, the trenches 18 extend entirely through the semiconductor layer 14 to the first main surface 12a of the semiconductor substrate 12. In some embodiments (not shown), the trenches 18 may even extend partially into the semiconductor substrate 12, depending on device requirements.

The trenches 18 are preferably etched using DRIE. DRIE utilizes an ionized gas, or plasma, such as, for example, sulfur hexafluoride ($SF_6$), to remove material from the semiconductor layer 14. DRIE technology permits deeper trenches 18 with straighter sidewalls. Furthermore, forming deeper trenches 18 that have straighter sidewalls than conventionally etched or formed trenches 18, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more). Other techniques for forming the trenches 18 can be used, however, such as plasma etching, reactive ion etching (RIE), sputter etching, vapor phase etching, chemical etching, or the like.

A mask (not shown) is selectively applied over the main surface 14a of the semiconductor layer 14. The mask may be created by deposition of a layer of photoresist or in some other manner well known to those skilled in the art. The developed photoresist is removed and undeveloped photoresist remains in place as is known in the art. For simplification, the mask refers to the material used to prevent certain areas of a semiconductor or other material from being etched, doped, coated or the like. In the embodiment shown in FIGS. 1-7, the mask is placed on the buffer dielectric layer 16. The trenches 18 are formed in the areas not covered by the mask. After the trenching process, the mask is removed using techniques known in the art.

The sidewalls of each trench 18 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Figure 2:
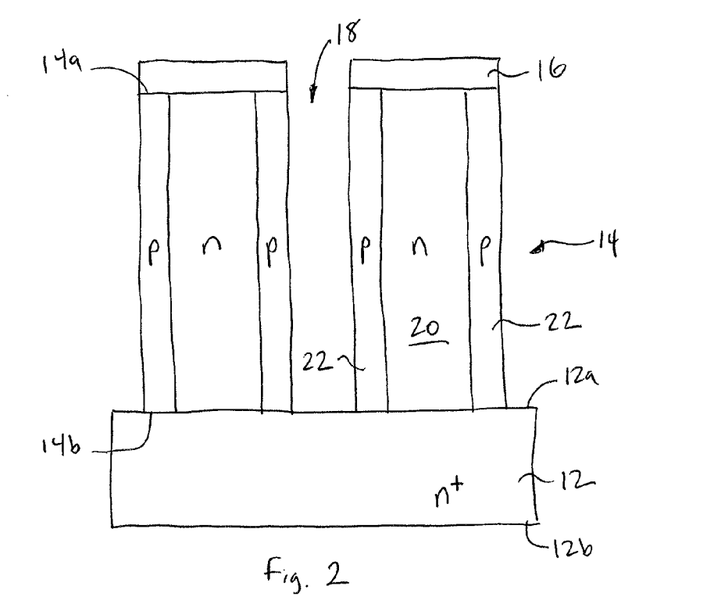
FIG. 2 is a partial sectional elevational view of the semiconductor layer of FIG. 1 following doping of the trench sidewalls.

Referring to FIG. 2, the sidewalls of the trenches 18 are implanted or doped with an n-type dopant, which may occur at predetermined implantation angles, which are determined by the width of the trenches 18 and the desired doping depth, and are typically from about 2° to 12° (−2° to −12°) from vertical. The implant is done at angles so that the bottom of each trench 18 is not implanted. Preferably, the implantation occurs at least partially, and preferably entirely, between the first and second main surfaces 14a, 14b of the semiconductor layer 14. The implant is performed at an energy level of about 30-200 kilo-electron-Volts (KeV) with dose ranges from about 1E13 to 1E14 cm$^{-2}$ (i.e., about $1\times10^{13}$ to $1\times10^{14}$ cm$^{-2}$). Consequently, a dopant of the first conductivity type (e.g., n-type) is implanted into the mesas to form at the sidewall surfaces of the trench 18 doped regions of the first conductivity type having a doping concentration higher than that of the lightly-doped semiconductor layer 14. The doping preferably occurs with the aid of a mask (not shown) placed over the first main surface 14a of the semiconductor layer 14.

The doping is performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping. Preferably, the doping is performed by ion implantation.

Following implanting, a drive in step at a temperature of up to 1200° Celsius may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention.

After the above doping step, a similar second doping step occurs with respect to the sidewalls of the trenches 18, but with a dopant of the opposite conductivity type (e.g., p-type). Drive-in of the two dopants may occur after each implantation step, or simultaneously. The result is the formation of n and p regions (columns) 20, 22 in the active region mesas. In the embodiment shown in FIGS. 1-7, the p columns 22 are each located between the adjacent trenches 18 and the n column 20.

Figure 3:
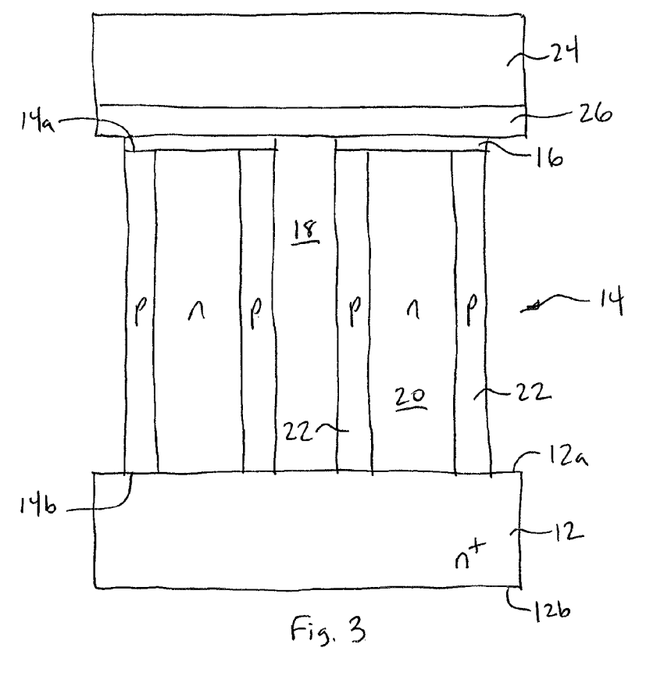
FIG. 3 is a partial sectional elevational view of the semiconductor layer of FIG. 2 following bonding of a substrate and dielectric layer thereto.

Referring to FIG. 3, the buffer oxide layer 16 may be etched or otherwise thinned, if necessary. A substrate 24, such as a handle wafer or the like, is preferably provided with a sealing dielectric layer 26 provided on a main surface thereof. The substrate 24 is preferably also formed of silicon (Si), but may be formed of other materials such as gallium arsenide (GaAs), germanium (Ge), or the like. The substrate 24 is preferably oxidized to form the sealing dielectric layer 26, which is preferably an oxide material. In preferred embodiments, the buffer dielectric layer 16 and the sealing dielectric layer 26 are made from the same material.

The sealing dielectric layer 26 is preferably bonded, directly or indirectly, to the first main surface 14a of the semiconductor layer 14. In the embodiment shown in FIGS. 1-7, this is done by bonding the buffer dielectric layer 16 and the sealing dielectric layer 26 together. Consequently, sealing dielectric layer 26 covers, and preferably seals, the trenches 18 and covers at least a portion of the first main surface 14a of the semiconductor layer 14. The bonding/annealing process may include heating the layers in an annealing furnace for a number of minutes or hours. For example, the semiconductor layer 14, buffer dielectric layer 16, substrate 24, and sealing dielectric layer 26 may be placed in an annealing furnace at 800-1200° C. for few a minutes to several hours to cause the materials to sufficiently bond. The annealing process may be performed in an inert ambient atmosphere, e.g., nitrogen gas, or in an oxidizing ambient atmosphere, e.g., pure oxygen, oxygen/nitrogen mixture, steam or the like. During a "wet" anneal, i.e., when steam is the ambient, the steam is generated using a mixture of oxygen and hydrogen typically above 800° C.

Figure 4:
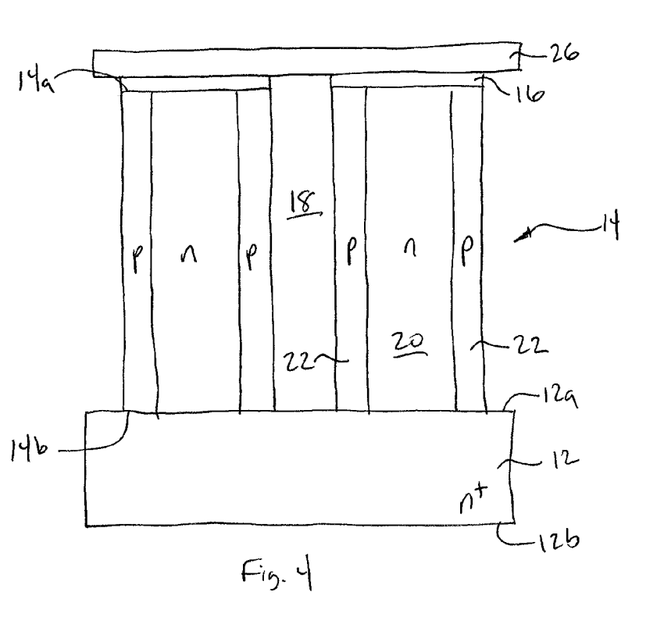
FIG. 4 is a partial sectional elevational view of the semiconductor layer of FIG. 3 following removal of the substrate.

Referring to FIG. 4, the substrate 24 is subsequently removed, preferably through planarization using known techniques, such as chemical-mechanical polishing (CMP) or the like. The planarization can also be used to level and smooth the remaining sealing dielectric layer 26, if necessary.

Figure 5:
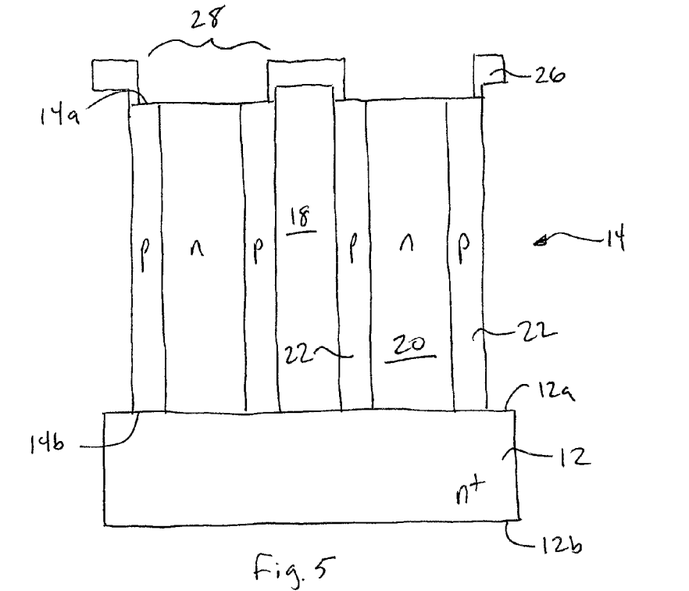
FIG. 5 is a partial sectional elevational view of the semiconductor layer of FIG. 4 following etching of the dielectric layer to form active areas.

Referring to FIG. 5, at least a portion of the sealing dielectric layer 26 (and the buffer dielectric layer 16, to the extent any remains) is removed from the first main surface 14a of the semiconductor layer 14 to form at least one, and preferably a plurality of active regions 28. The dielectric layers 26, 16 may be removed via chemical and/or mechanical etching techniques, polishing, grinding, or the like. Preferably, portions of the sealing dielectric layer 26 covering the trenches 18 remain following the exposure of the active regions 28.

Figure 6:
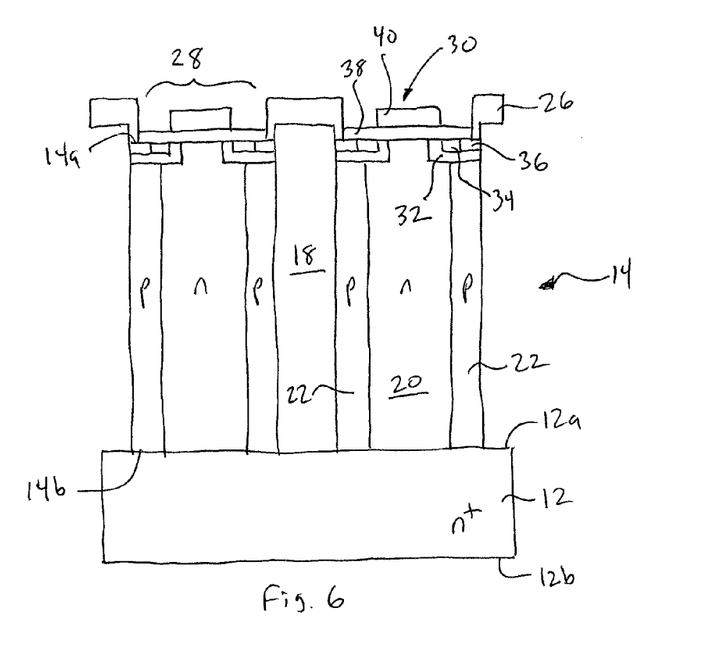
FIG. 6 is a partial sectional elevational view of the semiconductor layer of FIG. 5 following device formation.

Referring to FIG. 6, devices 30 are formed in the active regions 28 of the semiconductor layer 14. For example, one or more body regions 32 proximate the first main surface 14a of the semiconductor layer 14 in the active region 28 may be formed. The body regions 26 are preferably of p-type conductivity, having a dopant concentration suitable for forming inversion layers that operate as conduction channels of the device. In preferred embodiments, the body regions 32 are formed by depositing an oxide layer (not shown) over the first main surface 14a of the semiconductor layer 14, followed by the ion implantation of a p-type dopant (or n-type dopant) into the n and p columns 20, 22 through the oxide layer at an energy level of about 30-1000 KeV with a dose range from about $1\times10^{10}$ to $1\times10^{16}$ atoms $cm^{-2}$, preferably from about $1\times10^{14}$ to $1\times10^{16}$ atoms $cm^{-2}$, followed by a high temperature drive-in step (i.e., a diffusion). Other methods may be utilized as are known in the art. In addition, the body regions 32 can be formed at least partially by performing ion implantation of the sidewalls of the trenches 18. However, such a step would have to be performed prior to covering the trenches 18 with the sealing dielectric layer 26.

Source/drain regions 34 may also be formed proximate the first main surface 14a of the semiconductor layer 14 and within the body regions 32. The source/drain regions 34 are preferably a heavily doped $n^+$ type region, which may be formed using techniques similar to those described above for formation of the body regions 32. The orientation of the source/drain region 34 with respect to the body region 32 is not limited, and can be varied depending upon the desired configuration of the device 30. Further, there is no limit to the order in which the two regions 32, 34 may be formed. Moreover, additional regions, such as a body-contact region 36 (preferably a heavily doped $p^+$ type region) adjacent the source/drain region 34 and within the body region 32, may be formed without departing from the spirit and scope of the invention.

At least a portion of an interlayer dielectric layer 38 may be formed over the active regions 28 using known methods as are described above. Subsequent to formation of the interlayer dielectric layer 38, gates 40 are preferably formed thereon. The gates 40 may be composed of, for example, a metal, a doped polysilicon, an amorphous silicon, or a combination thereof, and formed by conventional techniques.

Figure 7:
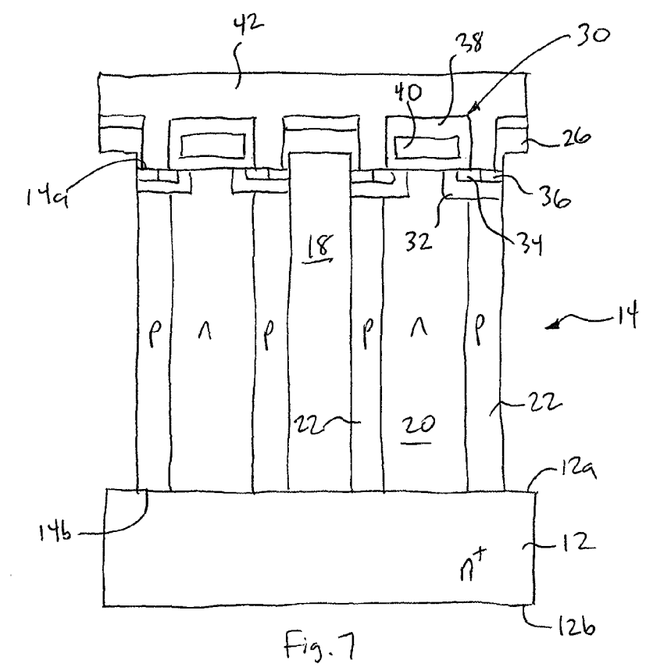
FIG. 7 is a partial sectional elevational view of the semiconductor layer of FIG. 6 following application of an electrode.

Referring to FIG. 7, a remaining portion of the interlayer dielectric layer 38 is preferably formed at least in the active regions 28 to encapsulate the gates 40. The remaining portion of the interlayer dielectric layer 38 may also extend over the remaining portions of the sealing dielectric layer 26. The interlayer dielectric layer 38 may then be planarized and/or polished. In some embodiments, the first portion of the interlayer dielectric layer 38 may be used as the oxide layer described above in formation of the body and source/drain regions 32, 34.

Contact holes are etched in the interlayer dielectric layer 38 to provide access to the source/drain regions 34. A metal electrode 42 is formed according to known techniques, which may extend into the contact holes to connect with the source/drain regions 34. It is also possible to connect the source/drain regions 34 to the metal contact 42 using separate plugs (not shown). Other steps (not shown), such as passivation, back-side electrode formation, and the like can also be performed as is conventionally known.

Figure 8:
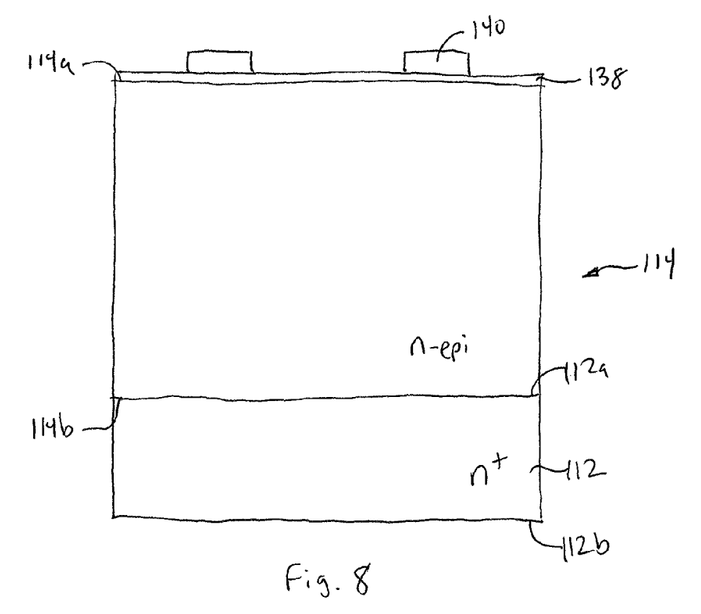
FIG. 8 is a partial sectional elevational view of a semiconductor layer with gates formed thereon in accordance with a second preferred embodiment of the present invention.

Referring to FIGS. 8-13, a second preferred method of manufacturing a superjunction device is shown. The second embodiment is similar to the first embodiment described above, and so a complete description of the method is omitted, with differences between the embodiments being provided below. Like numerals have been used for like elements, except the 100 series numerals have been used for the second embodiment. Referring to FIG. 8, a semiconductor substrate 112 is preferably provided having first and second opposing main surfaces 112a, 112b, and preferably is of the heavily doped $n^+$ type, as before. A semiconductor layer 114 having first and second opposing main surfaces 114a, 114b is also provided with the second main surface 114b of the semiconductor layer 114 being preferably attached to the first main surface 112a of the semiconductor substrate 112. In the second preferred embodiment, the semiconductor layer 112 is preferably composed of an epitaxially grown n-type silicon material, although other materials and doping concentrations may be used as well.

Figure 9:
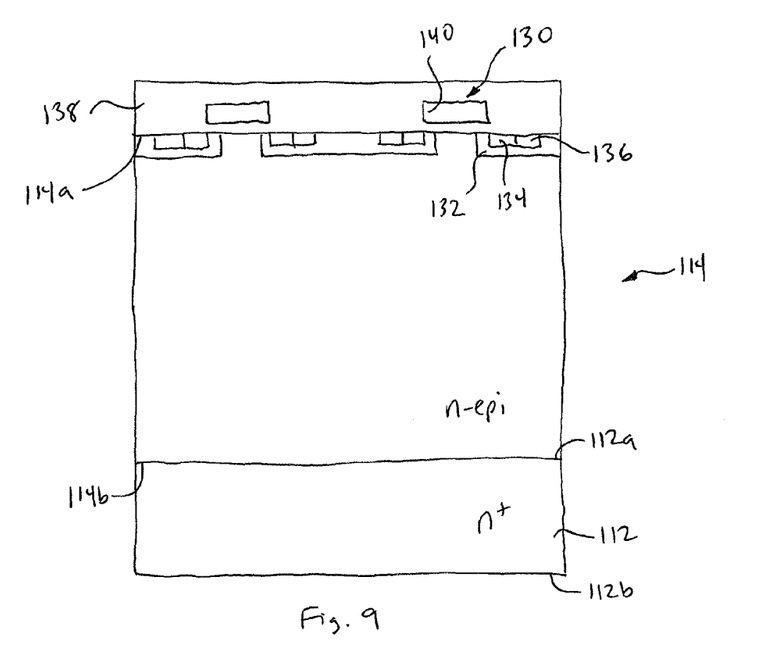
FIG. 9 is a partial sectional elevational view of the semiconductor layer of FIG. 8 following device formation.

A device 130 (FIG. 9) is formed proximate the first main surface 114a of the semiconductor layer 114, as follows. In FIG. 8, an interlayer dielectric layer 138 is formed on the first main surface 114a of the semiconductor layer 114. At least one, and preferably a plurality of gates 140 are formed on the interlayer dielectric layer 138. The gates 140 are preferably spaced apart from one another. Referring to FIG. 9, one or more body regions 132, preferably of p-type conductivity, may be formed proximate the first main surface 114a of the semiconductor layer 114. Further, source/drain regions 134, preferably of the heavily doped $n^+$ type, may also be formed proximate the first main surface 114a of the semiconductor layer 114 and within the body regions 132. Additional regions, such as a body-contact region 136 (preferably a heavily doped $p^+$ type region) adjacent the source/drain region 134 and within the body region 132, may also be formed. Following creation of the body, source/drain, and body contact regions 132, 134, 136, additional dielectric material may be added to the interlayer dielectric layer 138 to fully encapsulate the gates 140.

Figure 10:
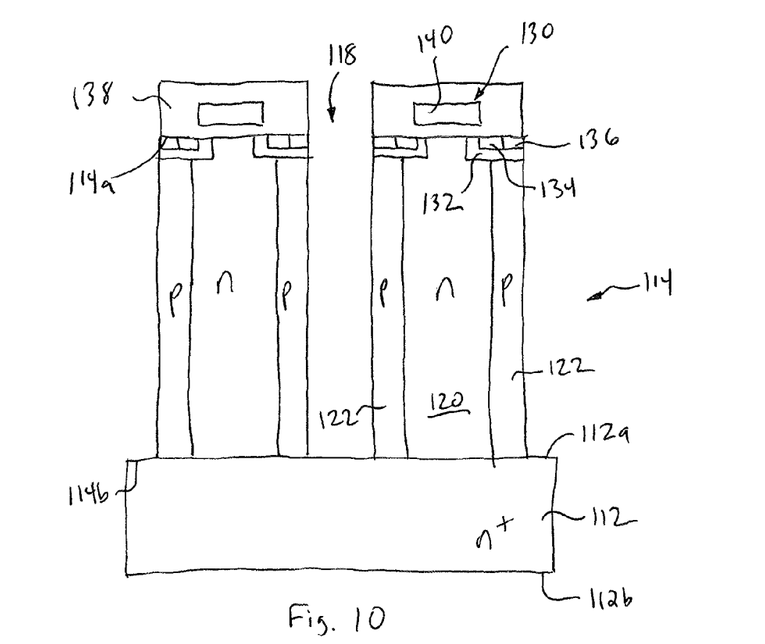
FIG. 10 is a partial sectional elevational view of the semiconductor layer of FIG. 9 following trench formation and sidewall doping.
Figure 11:
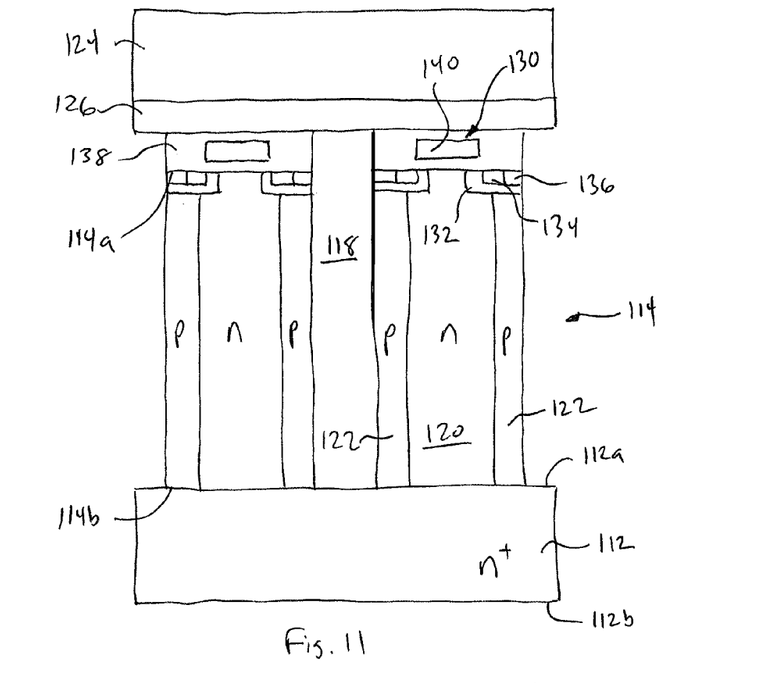
FIG. 11 is a partial sectional elevational view of the semiconductor layer of FIG. 10 following bonding of a substrate and dielectric layer thereto.

Referring to FIG. 10, at least one, and preferably a plurality of trenches 118 are formed extending through the interlayer dielectric layer 138 and at least partially into the semiconductor layer 114 from the first main surface 114a thereof. In the embodiment shown in FIGS. 8-13, the trenches 118 extend entirely through the semiconductor layer 114 to the first main surface 112a of the semiconductor substrate 112. The sidewalls of the trenches 118 are thereafter preferably doped or implanted to form the n- and p-columns 120, 122. In the second embodiment, preferably only one doping step with a p-type dopant is required to form the p-columns 122 adjacent to the trench 118 sidewalls, as the heavier original doping concentration of the semiconductor layer 114 is preferably sufficient to support the n-columns 120. Of course, the two-step doping as described with respect to the first embodiment can also be used.

Figure 12:
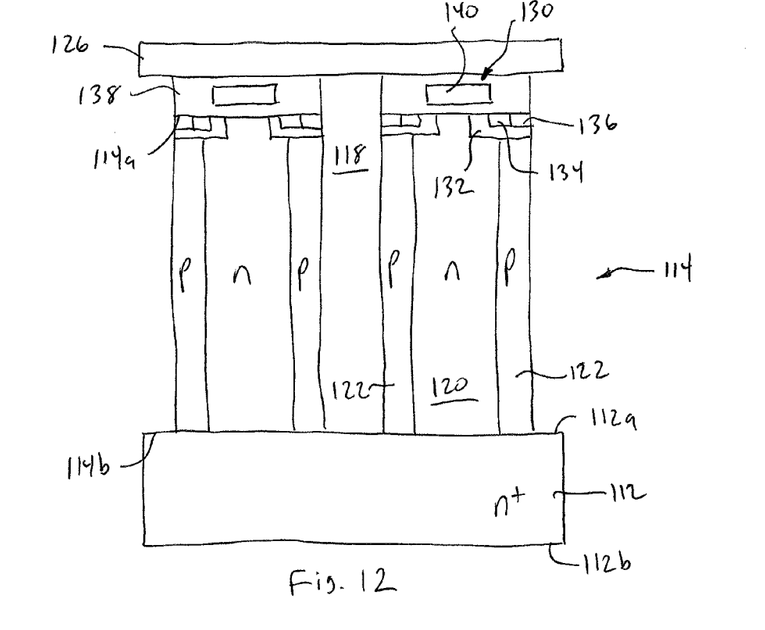
FIG. 12 is a partial sectional elevational view of the semiconductor layer of FIG. 11 following removal of the substrate.

As before, a substrate 124 is preferably provided with a sealing dielectric layer 126 provided on a main surface thereof. The sealing dielectric layer 126 is preferably bonded, directly or indirectly, to the first main surface 114a of the semiconductor layer 114 to cover the trenches 118 and at least a portion of each of the devices 130. In the embodiment shown in FIGS. 8-13, this is done by bonding the interlayer dielectric layer 138 and the sealing dielectric layer 126 together. Referring to FIG. 12, the substrate 124 is subsequently removed and planarization, thinning, or the like of the sealing layer 126 is preferably also performed.

Figure 13:
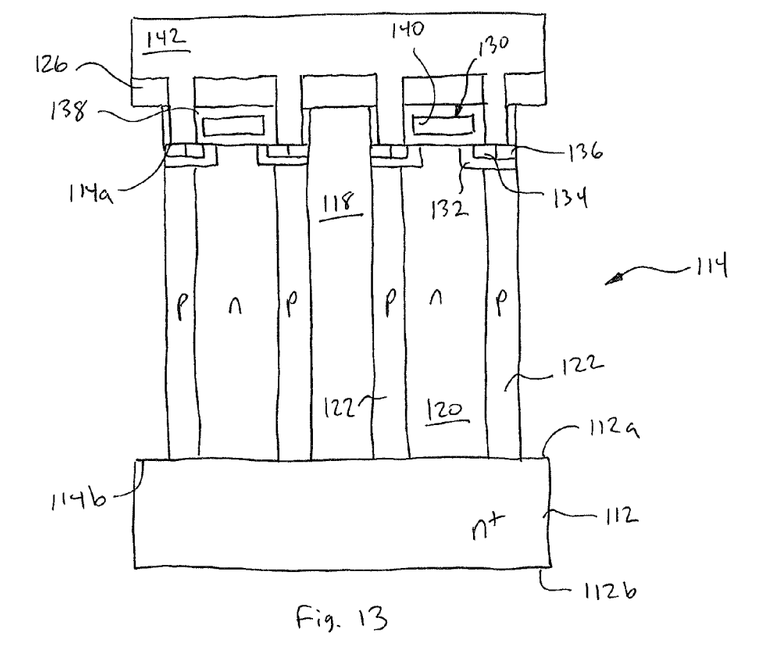
FIG. 13 is a partial sectional elevational view of the semiconductor layer of FIG. 12 following application of an electrode.

Referring to FIG. 13, contact holes are preferably etched in the sealing dielectric layer 126 and the interlayer dielectric layer 138 to provide access to the source/drain regions 134. A metal electrode 142 is formed extending into the contact holes to connect with the source/drain regions 134. Other steps (not shown), such as passivation, back-side electrode formation, and the like can also be performed as is conventionally known.

Figure 14:
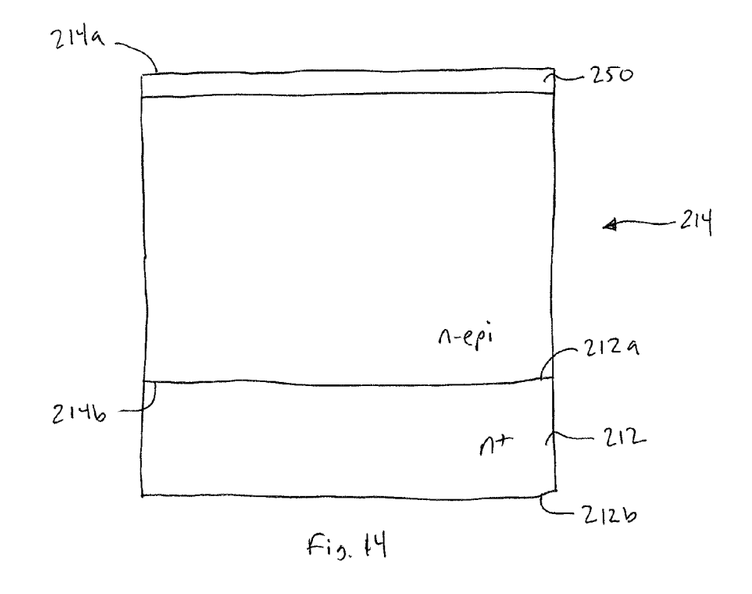
FIG. 14 is a partial sectional elevational view of a semiconductor layer with a doped region formed proximate a main surface thereof in accordance with a third preferred embodiment of the present invention.

Referring to FIGS. 14-19, a third preferred method of manufacturing a superjunction device is shown. The third embodiment is similar to the second embodiment described above, and so a complete description of the method is omitted, with differences between the embodiments being provided below. Like numerals have been used for like elements, except the 200 series numerals have been used for the third embodiment. Referring to FIG. 14, a semiconductor substrate 212 is preferably provided having first and second opposing main surfaces 212a, 212b, and preferably is of the heavily doped n+ type, as before. A semiconductor layer 214 having first and second opposing main surfaces 214a, 214b is also provided with the second main surface 214b of the semiconductor layer 214 being preferably attached to the first main surface 212a of the semiconductor substrate 212. As with the second preferred embodiment, the semiconductor layer 212 is preferably composed of an epitaxially grown n-type silicon material, although other materials and doping concentrations may be used as well.

Figure 15:
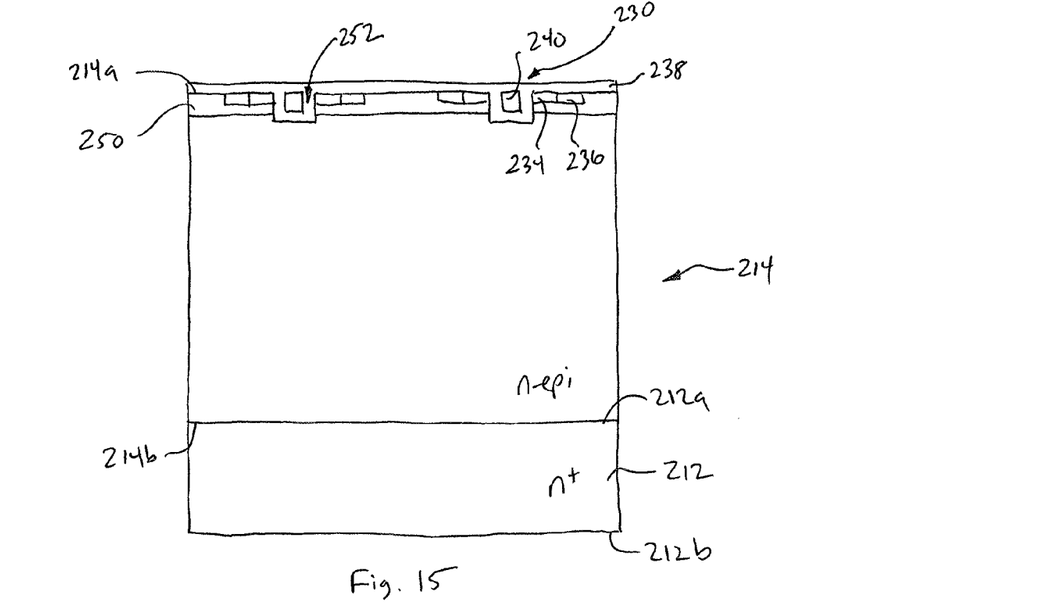
FIG. 15 is a partial sectional elevational view of the semiconductor layer of FIG. 14 following device formation.

In the third embodiment, the device 230 is preferably a "trench-gate" type, and may be formed as follows. The first main surface 214a of the semiconductor layer 214 is preferably doped with a p-type dopant to form a p-type layer 250. A sacrificial dielectric layer (not shown) may be formed prior to the doping step, if necessary. Referring to FIG. 15, at least one, and preferably a plurality of gate trenches 252 are formed in the semiconductor layer 214 from the first main surface 214a thereof. As shown in the third embodiment, the gate trenches 252 are preferably extend to about the same depth or only slightly deeper than the p-type layer 250. An interlayer dielectric layer 238 is formed at least within the gate trenches 252, and gates 240 are formed in the gate trenches 252, each being separated from the bottom and sidewalls of the respective gate trenches 252 by the interlayer dielectric material 238. Source/drain regions 234 (preferably of the heavily doped n+ type) and body contact regions 236 (preferably of the heavily doped p+ type) may be formed in the semiconductor layer 214 proximate the first main surface 214a thereof and within the p-type region 250. The remainder of the interlayer dielectric layer 238 may be formed on the first main surface 214a of the semiconductor layer 214, particularly extending over the gates 240 and corresponding gate trenches 252. This step may occur prior to or after the doping to form the source/drain and body contact regions 234, 236.

Figure 16:
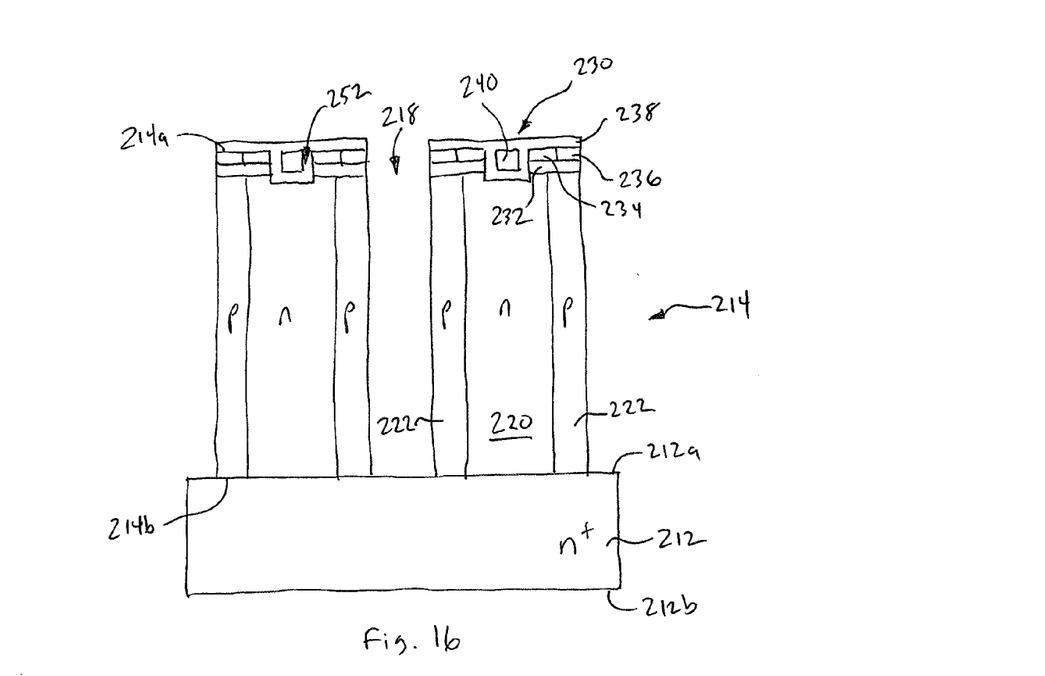
FIG. 16 is a partial sectional elevational view of the semiconductor layer of FIG. 15 following trench formation and sidewall doping.
Figure 17:
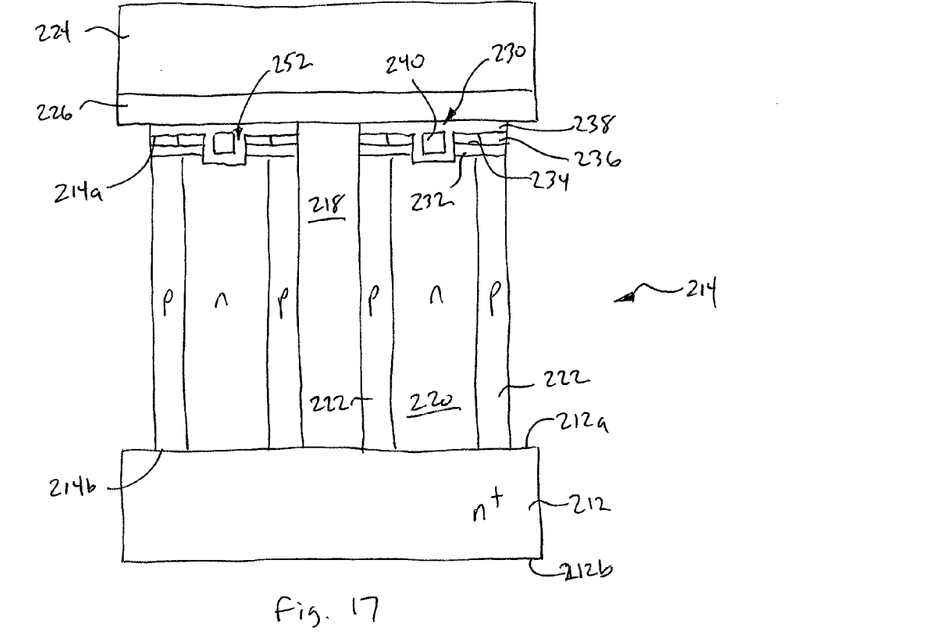
FIG. 17 is a partial sectional elevational view of the semiconductor layer of FIG. 16 following bonding of a substrate and a dielectric layer thereto.

Referring to FIG. 16, at least one, and preferably a plurality of trenches 218 are formed extending through the interlayer dielectric layer 238 and at least partially into the semiconductor layer 214 from the first main surface 214a thereof. In the embodiment shown in FIGS. 14-19, the trenches 218 extend entirely through the semiconductor layer 214 to the first main surface 212a of the semiconductor substrate 212 and separate the p-type region 250 into a plurality of body regions 232. The sidewalls of the trenches 218 are thereafter preferably doped or implanted to form the n- and p-columns 220, 222. As with the second embodiment, preferably only one doping step with a p-type dopant is required to form the p-columns 222 adjacent to the trench 218 sidewalls, as the heavier original doping concentration of the semiconductor layer 214 is preferably sufficient to support the n-columns 220. Of course, the two-step doping as described with respect to the first embodiment can also be used.

Figure 18:
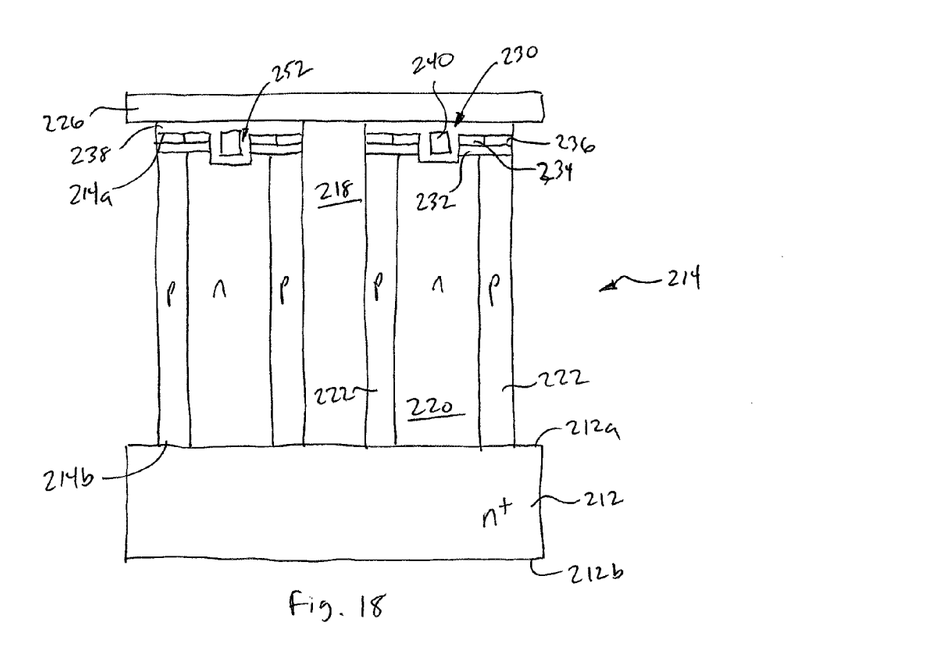
FIG. 18 is a partial sectional elevational view of the semiconductor layer of FIG. 17 following removal of the substrate.

As before, a substrate 224 is preferably provided with a sealing dielectric layer 226 provided on a main surface thereof. The sealing dielectric layer 226 is preferably bonded, directly or indirectly, to the first main surface 214a of the semiconductor layer 214 to cover the trenches 218 and at least a portion of each of the devices 230. In the embodiment shown in FIGS. 14-19, this is done by bonding the interlayer dielectric layer 238 and the sealing dielectric layer 226 together. Referring to FIG. 18, the substrate 224 is subsequently removed and planarization, thinning, or the like of the sealing layer 226 is preferably also performed.

Figure 19:
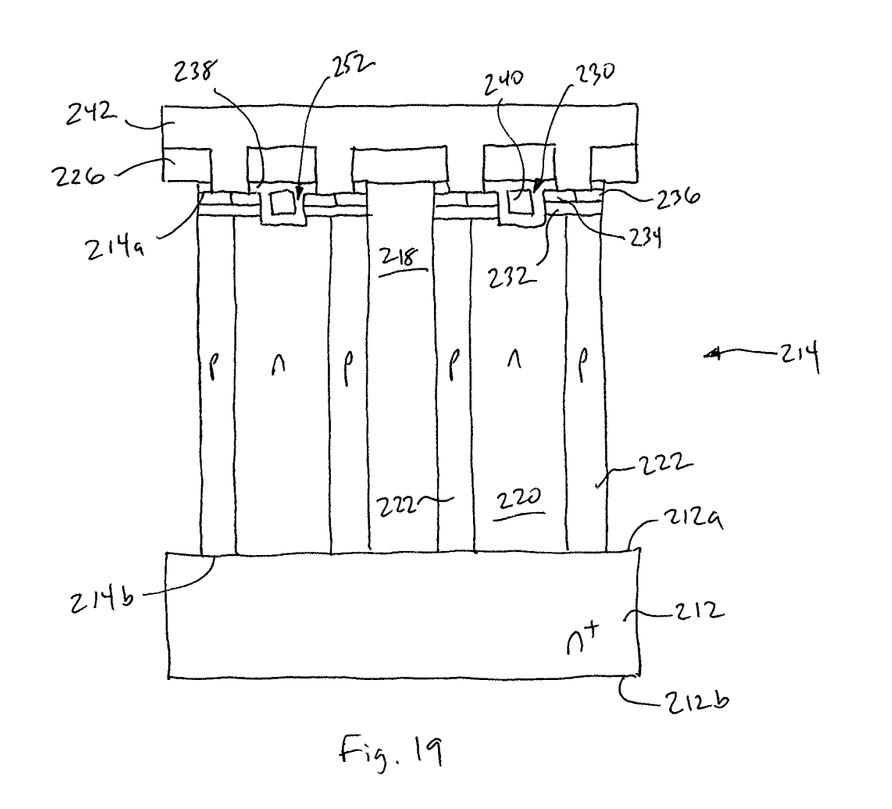
FIG. 19 is a partial sectional elevational view of the semiconductor layer of FIG. 18 following application of an electrode.

Referring to FIG. 19, contact holes are preferably etched in the sealing dielectric layer 226 and the interlayer dielectric layer 238 to provide access to the source/drain regions 234. A metal electrode 242 is formed extending into the contact holes to connect with the source/drain regions 234. Other steps (not shown), such as passivation, back-side electrode formation, and the like can also be performed as is conventionally known.

The process embodiments of the present invention are versatile as no particular sequence order of the steps is required, the n columns and p columns can be exchanged, and the like. The different embodiments may be used to make any type of semiconductor device, including, but not limited to, a superjunction MOSFET, a superjunction MESFET, a superjunction Schottky transistor, a superjunction IGBT, a thyristor, a diode, and similar devices.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method of forming a superjunction device, the method comprising:
   providing a semiconductor layer having first and second opposing main surfaces and a first doping concentration of a dopant of a first conductivity type;
   forming at least one trench extending at least partially into the semiconductor layer from the first main surface thereof;
   doping at least a portion of a sidewall of the at least one trench with the dopant of the first conductivity type to form a first region in the semiconductor layer extending at least partially between the first and second main surfaces of the semiconductor layer, the first region having a second doping concentration;
   doping at least a portion of the sidewall of the at least one trench with a dopant of a second conductivity type different from the first conductivity type to form a second region in the semiconductor layer between the sidewall of the at least one trench and the first region and extending at least partially between the first and second main surfaces of the semiconductor layer, the second region having a third doping concentration;
   providing a substrate with a first dielectric layer arranged thereon;
   bonding the first dielectric layer of the substrate to the first main surface of the semiconductor layer to cover the at least one trench and at least a portion of the first main surface;
   removing the substrate;
   removing at least a portion of the first dielectric layer from the first main surface of the semiconductor layer to form at least one active region; and
   forming a device in the at least one active region.

2. The method of claim 1, further comprising forming a second dielectric layer on the first main surface of the semiconductor layer.

3. The method of claim 2, wherein the at least one trench extends through the second dielectric layer.

4. The method of claim 3, wherein the bonding includes attaching the first dielectric layer to the second dielectric layer.

5. The method of claim 1, wherein the forming of the at least one device comprises:

forming a third region in the semiconductor layer proximate the first main surface and having a fourth doping concentration of the dopant of the second conductivity type, forming a fourth region in the semiconductor layer proximate the first main surface within the third region, the fourth region having a fifth doping concentration of the dopant of the first conductivity type, forming a third dielectric layer over the at least one active region, and forming a gate on the third dielectric layer.

6. The method of claim 5, further comprising forming a fifth region proximate the first main surface of the semiconductor layer within the third region and adjacent the fourth region, the fifth region having a sixth doping concentration of the dopant of the second conductivity type.

7. The method of claim 5, further comprising electrically connecting an electrode to the fourth region.

8. The method of claim 1, wherein the semiconductor layer is provided with the second main surface attached to a surface of a semiconductor substrate having a fourth doping concentration of the dopant of the first conductivity type.

9. The method of claim 8, wherein the at least one trench extends through the semiconductor layer to the surface of the semiconductor substrate.

10. A method of forming a superjunction device, the method comprising:

providing a semiconductor layer having first and second opposing main surfaces and a first doping concentration of a dopant of a first conductivity type;

forming at least one device proximate the first main surface of the semiconductor layer;

forming at least one trench adjacent to the at least one device and extending at least partially into the semiconductor layer from the first main surface thereof;

doping at least a portion of a sidewall of the at least one trench with a dopant of a second conductivity type different from the first conductivity type to form a first region in the semiconductor layer adjacent to the sidewall of the at least one trench and extending at least partially between the first and second main surfaces of the semiconductor layer, the first region having a second doping concentration;

providing a substrate with a first dielectric layer arranged thereon;

bonding the first dielectric layer of the substrate to the first main surface of the semiconductor layer to cover the at least one trench and at least a portion of the at least one device; and removing the substrate.

11. The method of claim 10, wherein the forming of the at least one device comprises:

forming a second dielectric layer on the first main surface of the semiconductor layer;

forming a gate on the second dielectric layer;

forming a second region in the semiconductor layer proximate the first main surface having a third doping concentration of the dopant of the second conductivity type, and forming a third region in the semiconductor layer proximate the first main surface and within the second region, the third region having a fourth doping concentration of the dopant of the first conductivity type.

12. The method of claim 11, further comprising forming a fourth region in the semiconductor layer proximate the first main surface within the second region and adjacent the third region, the fourth region having a fifth doping concentration of the dopant of the second conductivity type.

13. The method of claim 11, further comprising:

forming at least one contact hole through the first and second dielectric layers; and electrically connecting an electrode to the third region through the at least one contact hole.

14. The method of claim 11, wherein the bonding includes attaching the first dielectric layer to the second dielectric layer.

15. The method of claim 10, wherein the forming of the at least one device comprises:

forming a second region in the semiconductor layer proximate the first main surface having a third doping concentration of the dopant of the second conductivity type, forming at least one gate trench in the semiconductor layer extending from the first main surface thereof adjacent to the second region, forming a gate in the at least one gate trench, the gate being separated from sidewalls of the gate trench by a dielectric material, forming a third region in the semiconductor layer proximate the first main surface and within the second region, the third region having a fourth doping concentration of the dopant of the first conductivity type, and forming a second dielectric layer on the first main surface of the semiconductor layer, the second dielectric layer extending over the gate and the at least one gate trench.

16. The method of claim 15, further comprising forming a fourth region in the semiconductor layer in the semiconductor layer proximate the first main surface within the second region and adjacent the third region, the fourth region having a fifth doping concentration of the dopant of the second conductivity type.

17. The method of claim 15, further comprising:

forming at least one contact hole through the first and second dielectric layers; and electrically connecting an electrode to the third region through the at least one contact hole.

18. The method of claim 15, wherein the bonding includes attaching the first dielectric layer to the second dielectric layer.

19. The method of claim 10, wherein the semiconductor layer is provided with the second main surface attached to a surface of a semiconductor substrate having a third doping concentration of the dopant of the first conductivity type.

20. The method of claim 19, wherein the at least one trench extends through the semiconductor layer to the surface of the semiconductor substrate.

* * * * *